(12) United States Patent
Xu et al.

(10) Patent No.: US 8,836,288 B2
(45) Date of Patent: Sep. 16, 2014

(54) BATTERY HEATING CIRCUITS AND METHODS USING TRANSFORMERS

(75) Inventors: Wenhui Xu, Shenzhen (CN); Yaochuan Han, Shenzhen (CN); Wei Feng, Shenzhen (CN); Qinyao Yang, Shenzhen (CN); Wenjin Xia, Shenzhen (CN); Shibin Ma, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 324 days.

(21) Appl. No.: 13/189,096

(22) Filed: Jul. 22, 2011

(65) Prior Publication Data
US 2012/0161711 A1     Jun. 28, 2012

(30) Foreign Application Priority Data

Dec. 23, 2010 (CN) .......................... 2010 1 0603414

(51) Int. Cl.
*H02J 7/00* (2006.01)
*H01M 10/42* (2006.01)
*H01M 10/44* (2006.01)
*H01M 10/615* (2014.01)
*H01M 10/6571* (2014.01)

(52) U.S. Cl.
CPC .......... *H02J 7/0057* (2013.01); *H01M 10/5083* (2013.01); *H01M 10/425* (2013.01); *H01M 10/443* (2013.01); *H01M 10/5006* (2013.01); *H01M 2010/4271* (2013.01); *Y02E 60/12* (2013.01)
USPC ............ 320/129; 320/128; 320/136; 320/166

(58) Field of Classification Search
CPC . H02J 7/0093; H02J 7/0091; H01M 10/5006; H01M 10/5083; H01M 10/65
USPC .................................. 320/103, 128, 166, 129
See application file for complete search history.

(56) References Cited

U.S. PATENT DOCUMENTS

| 3,654,426 A | 4/1972 | Brinkmann et al. |
| 3,808,481 A | 4/1974 | Rippel |
| 4,171,508 A * | 10/1979 | Sinclair .......................... 429/120 |

(Continued)

FOREIGN PATENT DOCUMENTS

| CN | 1630129 A | 6/2005 |
| CN | 1630130 A | 6/2005 |

(Continued)

OTHER PUBLICATIONS

China Patent Office, Office Action dated Sep. 21, 2011, in related application CN 201010603658.3.

(Continued)

*Primary Examiner* — M'Baye Diao
(74) *Attorney, Agent, or Firm* — Jones Day

(57) ABSTRACT

Circuit and method for heating a battery. The heating circuit includes a switch unit, a switching control module, a one-way semiconductor component, a damping component and a transformer. The switching control module is electrically connected with the switch unit. The battery, the damping component, a first winding of the transformer, and the switch unit are connected in a first loop with each other to constitute a battery discharging circuit. The battery, the damping component, a second winding of the transformer, and the one-way semiconductor component are connected in a second loop with each other to constitute a battery charging circuit.

11 Claims, 6 Drawing Sheets

(56) References Cited

U.S. PATENT DOCUMENTS

| | | | |
|---|---|---|---|
| 4,184,197 A | 1/1980 | Cuk et al. | |
| 4,222,000 A | 9/1980 | Silvertown et al. | |
| 5,362,942 A | 11/1994 | Vanderslice, Jr. et al. | |
| 5,396,165 A * | 3/1995 | Hwang et al. | 323/210 |
| 5,444,448 A * | 8/1995 | Schuermann et al. | 342/42 |
| 5,461,556 A | 10/1995 | Horie et al. | |
| 5,768,114 A | 6/1998 | Gruning et al. | |
| 5,789,905 A | 8/1998 | Yamasaki | |
| 5,808,469 A | 9/1998 | Kopera | |
| 5,905,371 A | 5/1999 | Limpaecher | |
| 5,943,224 A | 8/1999 | Mao | |
| 5,948,298 A | 9/1999 | Ijaz | |
| 5,990,661 A | 11/1999 | Ashtiani et al. | |
| 6,002,240 A * | 12/1999 | McMahan et al. | 320/150 |
| 6,072,301 A | 6/2000 | Ashtiani et al. | |
| 6,078,163 A | 6/2000 | Horie et al. | |
| 6,211,652 B1 | 4/2001 | Glasgow | |
| 6,259,229 B1 * | 7/2001 | Ashtiani et al. | 320/128 |
| 6,340,879 B1 | 1/2002 | Bläcker | |
| 6,771,518 B2 | 8/2004 | Orr et al. | |
| 6,882,061 B1 | 4/2005 | Ashtiani et al. | |
| 7,292,010 B2 | 11/2007 | Hsu et al. | |
| 7,382,102 B2 | 6/2008 | Ashtiani | |
| 7,402,982 B2 | 7/2008 | Ito et al. | |
| 7,876,583 B2 | 1/2011 | Polivka et al. | |
| 8,004,866 B2 | 8/2011 | Bucella et al. | |
| 8,197,502 B2 | 6/2012 | Smith et al. | |
| 8,493,036 B2 | 7/2013 | Ferrario | |
| 2005/0077879 A1* | 4/2005 | Near | 320/166 |
| 2005/0156578 A1* | 7/2005 | Kamenoff | 320/165 |
| 2005/0168195 A1 | 8/2005 | MacDougall | |
| 2005/0264237 A1 | 12/2005 | Ishizuka | |
| 2007/0024243 A1 | 2/2007 | Liu et al. | |
| 2007/0121258 A1* | 5/2007 | Hachiya | 361/18 |
| 2009/0014436 A1* | 1/2009 | Toya et al. | 219/533 |
| 2009/0243547 A1 | 10/2009 | Andelfinger | |
| 2011/0095711 A1 | 4/2011 | Hsieh et al. | |
| 2011/0144861 A1 | 6/2011 | Lakirovich et al. | |
| 2011/0273136 A1 | 11/2011 | Yoshimoto | |
| 2012/0024838 A1 | 2/2012 | Xu et al. | |
| 2012/0025754 A1 | 2/2012 | Xu et al. | |
| 2012/0025755 A1 | 2/2012 | Xu et al. | |
| 2012/0025756 A1 | 2/2012 | Xu et al. | |
| 2012/0025772 A1 | 2/2012 | Xu et al. | |
| 2012/0025774 A1 | 2/2012 | Xu et al. | |
| 2012/0025775 A1 | 2/2012 | Xu et al. | |
| 2012/0025776 A1 | 2/2012 | Xu et al. | |
| 2012/0025777 A1 | 2/2012 | Xu et al. | |
| 2012/0025778 A1 | 2/2012 | Xu et al. | |
| 2012/0025779 A1* | 2/2012 | Xu et al. | 320/129 |
| 2012/0025780 A1 | 2/2012 | Xu et al. | |
| 2012/0025781 A1 | 2/2012 | Xu et al. | |
| 2012/0025782 A1 | 2/2012 | Xu et al. | |
| 2012/0025783 A1 | 2/2012 | Xu et al. | |
| 2012/0031890 A1 | 2/2012 | Han et al. | |
| 2012/0032642 A1 | 2/2012 | Xu et al. | |
| 2012/0126753 A1 | 5/2012 | Carkner | |
| 2012/0279951 A1 | 11/2012 | Xu et al. | |
| 2012/0280658 A1 | 11/2012 | Xu et al. | |
| 2012/0280659 A1 | 11/2012 | Xu et al. | |
| 2012/0299551 A1 | 11/2012 | Xu et al. | |
| 2012/0306432 A1 | 12/2012 | Xu et al. | |
| 2013/0127398 A1 | 5/2013 | Xu et al. | |
| 2013/0134146 A1 | 5/2013 | Han et al. | |
| 2013/0134945 A1 | 5/2013 | Xu et al. | |
| 2013/0141032 A1 | 6/2013 | Xu et al. | |

FOREIGN PATENT DOCUMENTS

| | | |
|---|---|---|
| CN | 1809942 A | 7/2006 |
| CN | 1836356 A | 9/2006 |
| CN | 1291518 C | 12/2006 |
| CN | 101552479 A | 10/2009 |
| CN | 201397868 Y | 2/2010 |
| CN | 101685971 A | 3/2010 |
| CN | 201435426 Y | 3/2010 |
| CN | 201667552 U | 12/2010 |
| CN | 102055042 A | 5/2011 |
| CN | 102074756 A | 5/2011 |
| CN | 201936966 U | 8/2011 |
| CN | 201936967 U | 8/2011 |
| CN | 201936969 U | 8/2011 |
| CN | 201966300 U | 9/2011 |
| CN | 202009059 U | 10/2011 |
| CN | 202042567 U | 11/2011 |
| CN | 202076380 U | 12/2011 |
| CN | 202103139 U | 1/2012 |
| CN | 202121024 U | 1/2012 |
| CN | 102074755 B | 5/2012 |
| CN | 102074758 B | 6/2012 |
| CN | 102074759 B | 6/2012 |
| CN | 102074753 B | 7/2012 |
| CN | 102074756 B | 7/2012 |
| CN | 102074760 B | 7/2012 |
| CN | 102074762 B | 7/2012 |
| CN | 102074761 B | 9/2012 |
| CN | 102088117 B | 9/2012 |
| CN | 102082306 B | 11/2012 |
| CN | 102088116 B | 11/2012 |
| EP | 0 418 919 A2 | 3/1991 |
| EP | 1 930 922 A2 | 6/2008 |
| JP | 4-12472 A | 1/1992 |
| JP | 5022876 A | 1/1993 |
| JP | 2007-166779 A | 6/2007 |
| JP | 4016045 B2 | 12/2007 |
| SU | 813544 B | 3/1981 |
| TW | 220014 B | 2/1994 |
| TW | 269727 B | 2/1996 |
| TW | 344721 B | 11/1998 |
| TW | 200518370 A | 6/2005 |
| TW | 200527793 A | 8/2005 |
| TW | M275625 U | 9/2005 |
| WO | WO 2010/145439 A1 | 12/2010 |

OTHER PUBLICATIONS

China Patent Office, Office Action dated Jul. 27, 2011, in related application CN 201010603717.7.
China Patent Office, Office Action dated Jul. 27, 2011, in related application CN 201010604714.5.
China Patent Office, Office Action dated Sep. 5, 2011, in related application CN 201010606082.6.
China Patent Office, Office Action dated Sep. 21, 2011, in related application CN 201010605772.X.
China Patent Office, Office Action dated Feb. 2, 2012, in related application CN 201010604777.0.
China Patent Office, Office Action dated Sep. 2, 2011, in related application CN 201010604777.0.
China Patent Office, Office Action dated Jan. 9, 2012, in related application CN 201010604729.1.
China Patent Office, Office Action dated Jul. 18, 2011, in related application CN 201010604729.1.
China Patent Office, Office Action dated Dec. 28, 2011, in related application CN 201010603719.6.
China Patent Office, Office Action dated Jul. 28, 2011, in related application CN 201010603719.6.
China Patent Office, Office Action dated Jan. 5, 2012, in related application CN 201010603471.3.
China Patent Office, Office Action dated Jul. 15, 2011, in related application CN 201010603471.3.
Ciiina Patent Office, Office Action dated Jul. 27, 2011, in related application CN 201010603414.5.
China Patent Office, Office Action dated Nov. 16, 2011, in related application CN 201010603414.5.
China Patent Office, Office Action dated Aug. 1, 2011, in related application CN 201010603669.1.
China Patent Office, Office Action dated Sep. 15, 2011, in related application CN 201010604677.8.
China Patent Office, Office Action dated Feb. 2, 2012, in related application CN 201010604744.6.

(56) References Cited

OTHER PUBLICATIONS

China Patent Office, Office Action dated Sep. 20, 2011, in related application CN 201010604744.6.
China Patent Office, Office Action dated Oct. 25, 2011, in related application CN 201110080853.7.
China Patent Office, Office Action dated Nov. 1, 2011, in related application CN 201110081219.5.
China Patent Office, Office Action dated Jan. 21, 2012, in related application CN 201110081276.3.
China Patent Office, Office Action dated Jun. 5, 2012, in related application CN 201110081276.3.
China Patent Office, Office Action dated May 16, 2012, in related application CN 201110137264.8.
China Patent Office, Office Action dated Jan. 21, 2012, in related application CN 201110132362.2.
China Patent Office, Office Action dated Jan. 21, 2012, in related application CN 201110134005.X.
China Patent Office, Office Action dated May 2, 2012, in related application CN 201110134005.X.
European Patent Office, Extended European Search Report dated Sep. 13, 2011, in related application EP 11166955.2.
European Patent Office, Extended European Search Report dated Nov. 30, 2011, in related application EP 11166938.8.
European Patent Office, Extended European Search Report dated Dec. 15, 2011, in related application EP 11166941.2.
European Patent Office, Extended European Search Report dated Sep. 16, 2011, in related application EP 11166949.5.
European Patent Office, Extended European Search Report dated Oct. 6, 2011, in related application EP 11166925.5.
European Patent Office, European Search Report dated Sep. 29, 2011, in related application EP 11166958.6.
European Patent Office, Extended European Search Report dated Jan. 25, 2012, in related application EP 11166952.9.
European Patent Office, European Search Report dated Sep. 21, 2011, in related application EP 11166969.3.
European Patent Office, European Search Report dated Sep. 1, 2011, in related application EP 11166903.2.
European Patent Office, Extended European Search Report dated Nov. 8, 2011, in related application EP 11166872.9.
European Patent Office, Extended European Search Report dated Nov. 25, 2011, in related application EP 11166882.8.
European Patent Office, Extended European Search Report dated Nov. 25, 2011, in related application EP 11166897.6.
European Patent Office, Extended European Search Report dated Sep. 6, 2011, in related application EP 11166900.8.
European Patent Office, Extended European Search Report dated Sep. 23, 2011, in related application EP 11166914.9.
European Patent Office, Extended European Search Report dated Nov. 8, 2011, in related application EP 11166920.6.
European Patent Office, Extended European Search Report dated Sep. 27, 2011, in related application EP 11167066.7.
European Patent Office, Extended European Search Report dated Sep. 8, 2011, in related application EP 11166902.4.
European Patent Office, Extended European Search Report dated Oct. 6, 2011, in related application EP 11167128.5.
Patent Cooperation Treaty, International Search Report and Written Opinion, dated Sep. 1, 2011, in related application PCT/CN2011/074449.
Patent Cooperation Treaty, International Search Report and Written Opinion, dated Aug. 18, 2011, in related application PCT/CN2011/074453.
Patent Cooperation Treaty, International Search Report and Written Opinion, dated Aug. 11, 2011, in related application PCT/CN2011/074463.
Patent Cooperation Treaty, International Search Report and Written Opinion, dated Aug. 25, 2011, in related application PCT/CN2011/074458.
Patent Cooperation Treaty, International Search Report and Written Opinion, dated Aug. 11, 2011, in related application PCT/CN2011/074462.
Patent Cooperation Treaty, International Search Report and Written Opinion, dated Aug. 11, 2011, in related application PCT/CN2011/074457.
Patent Cooperation Treaty, International Search Report and Written Opinion, dated Aug. 25, 2011, in related application PCT/CN2011/074459.
Patent Cooperation Treaty, International Search Report and Written Opinion, dated Aug. 18, 2011, in related application PCT/CN2011/074456.
Patent Cooperation Treaty, International Search Report and Written Opinion, dated Aug. 18, 2011, in related application PCT/CN2011/074460.
Patent Cooperation Treaty, International Search Report and Written Opinion, dated Aug. 11, 2011, in related application PCT/CN2011/074433.
Patent Cooperation Treaty, International Search Report and Written Opinion, dated Aug. 18, 2011, in related application PCT/CN2011/074436.
Patent Cooperation Treaty, International Search Report and Written Opinion, dated Aug. 25, 2011, in related application PCT/CN2011/074438.
Patent Cooperation Treaty, International Search Report and Written Opinion, dated Aug. 11, 2011, in related application PCT/CN2011/074440.
Patent Cooperation Treaty, International Search Report and Written Opinion, dated Aug. 25, 2011, in related application PCT/CN2011/074455.
Patent Cooperation Treaty, International Search Report and Written Opinion, dated Aug. 11, 2011, in related application PCT/CN2011/074461.
Patent Cooperation Treaty, International Search Report and Written Opinion, dated Sep. 1, 2011, in related application PCT/CN2011/074531.
Patent Cooperation Treaty, International Search Report and Written Opinion, dated Aug. 18, 2011, in related application PCT/CN2011/074442.
Patent Cooperation Treaty, International Search Report and Written Opinion, dated Jul. 21, 2011, in related application PCT/CN2011/074536.
United States Patent and Trademark Office, Office Action mailed Jul. 16, 2013, in related U.S. Appl. No. 13/166,281.
United States Patent and Trademark Office, Office Action mailed May 31, 2013, in related U.S. Appl. No. 13/168,004.
United States Patent and Trademark Office, Office Action mailed May 22, 2013, in related U.S. Appl. No. 13/168,014.
United States Patent and Trademark Office, Office Action mailed Jul. 5, 2013, in related U.S. Appl. No. 13/170,021.
United States Patent and Trademark Office, Office Action mailed Jul. 30, 2013, in related U.S. Appl. No. 13/166,301.
United States Patent and Trademark Office, Office Action mailed Aug. 29, 2013, in related U.S. Appl. No. 13/187,874.
United States Patent and Trademark Office, Office Action mailed Aug. 29, 2013, in related U.S. Appl. No. 13/189,114.
United States Patent and Trademark Office, Office Action mailed Sep. 30, 2013, in related U.S. Appl. No. 13/170,044.
United States Patent and Trademark Office, Office Action mailed Jun. 19, 2013, in related U.S. Appl. No. 13/187,890.
United States Patent and Trademark Office, Final Office Action mailed Feb. 25, 2014, in related U.S. Appl. No. 13/170,021.
Taiwan Intellectual Property Office, Office Action dated Jan. 10, 2014, in related application TW 100143128.
Taiwan Intellectual Property Office, Office Action dated Jan. 10, 2014, in related application TW 100143130.
Taiwan Intellectual Property Office, Office Action dated Jan. 10, 2014, in related application TW 100143133.
Taiwan Intellectual Property Office, Office Action dated Jan. 7, 2014, in related application TW 100140587.
Taiwan Intellectual Property Office, Office Action dated Jan. 6, 2014, in related application TW 100140588.
Taiwan Intellectual Property Office, Office Action dated Feb. 17, 2014, in related application TW 100143160.
Taiwan Intellectual Property Office, Office Action dated Jan. 6, 2014, in related application TW 100140590.

(56) References Cited

OTHER PUBLICATIONS

Taiwan Intellectual Property Office, Office Action dated Jan. 17, 2014, in related application TW 100141797.
Taiwan Intellectual Property Office, Office Action dated Jan. 17, 2014, in related application TW 100141802.
United States Patent and Trademark Office, Notice of Allowance mailed Nov. 8, 2013, in related U.S. Appl. No. 13/166,301.
United States Patent and Trademark Office, Office Action mailed Nov. 20, 2013, in related U.S. Appl. No. 13/168,004.
United States Patent and Trademark Office, Office Action mailed Nov. 22, 2013, in related U.S. Appl. No. 13/168,014.
United States Patent and Trademark Office, Office Action mailed Jan. 6, 2014, in related U.S. Appl. No. 13/187,266.
United States Patent and Trademark Office, Office Action mailed Jan. 3, 2014, in related U.S. Appl. No. 13/184,906.
United States Patent and Trademark Office, Office Action mailed Jan. 2, 2014, in related U.S. Appl. No. 13/189,114.
United States Patent and Trademark Office, Office Action mailed Dec. 3, 2013, in related U.S. Appl. No. 13/187,279.
United States Patent and Trademark Office, Office Action mailed Dec. 4, 2013, in related U.S. Appl. No. 13/187,890.
United States Patent and Trademark Office, Office Action mailed Jan. 6, 2014, in related U.S. Appl. No. 13/541,487.
United States Patent and Trademark Office, Office Action mailed Dec. 4, 2013, in related U.S. Appl. No. 13/748,525.
United States Patent and Trademark Office, Office Action mailed Jan. 15, 2014, in related U.S. Appl. No. 13/749,480.
United States Patent and Trademark Office, Notice of Allowance mailed Dec. 5, 2013, in related U.S. Appl. No. 13/166,281.
United States Patent and Trademark Office, Notice of Allowance mailed Jan. 6, 2014, in related U.S. Appl. No. 13/187,874.
United States Patent and Trademark Office, Office Action mailed Jun. 10, 2014, in related U.S. Appl. No. 13/168,004.
United States Patent and Trademark Office, Office Action mailed Jun. 18, 2014, in related U.S. Appl. No. 13/168,014.
United States Patent and Trademark Office, Office Action mailed Jun. 16, 2014, in related U.S. Appl. No. 13/184,879.
United States Patent and Trademark Office, Office Action mailed Jun. 20, 2014, in related U.S. Appl. No. 13/184,894.
United States Patent and Trademark Office, Office Action mailed Jun. 25, 2014, in related U.S. Appl. No. 13/187,266.
United States Patent and Trademark Office, Office Action mailed Jun. 24, 2014, in related U.S. Appl. No. 13/184,906.
United States Patent and Trademark Office, Office Action mailed Jun. 17, 2014, in related U.S. Appl. No. 13/185,744.
United States Patent and Trademark Office, Office Action mailed Jun. 16, 2014, in related U.S. Appl. No. 13/184,915.
United States Patent and Trademark Office, Office Action mailed Jun. 24, 2014, in related U.S. Appl. No. 13/187,279.
United States Patent and Trademark Office, Office Action mailed Jun. 13, 2014, in related U.S. Appl. No. 13/185,756.
United States Patent and Trademark Office, Office Action mailed Jul. 7, 2014, in related U.S. Appl. No. 13/187,890.
United States Patent and Trademark Office, Office Action mailed Jun. 25, 2014, in related U.S. Appl. No. 13/541,487.
United States Patent and Trademark Office, Office Action mailed Jun. 26, 2014, in related U.S. Appl. No. 13/748,525.
United States Patent and Trademark Office, Office Action mailed Jun. 24, 2014, in related U.S. Appl. No. 13/749,480.
United States Patent and Trademark Office, Notice of Allowance mailed Apr. 25, 2014, in related U.S. Appl. No. 13/166,281.
United States Patent and Trademark Office, Notice of Allowance mailed Jun. 24, 2014, in related U.S. Appl. No. 13/170,021.
United States Patent and Trademark Office, Notice of Allowance mailed May 2, 2014, in related U.S. Appl. No. 13/166,301.
United States Patent and Trademark Office, Notice of Allowance mailed May 8, 2014, in related U.S. Appl. No. 13/187,874.
United States Patent and Trademark Office, Notice of Allowance mailed Apr. 28, 2014, in related U.S. Appl. No. 13/189,114.
United States Patent and Trademark Office, Notice of Allowance mailed May 22, 2014, in related U.S. Appl. No. 13/170,044.

* cited by examiner

BATTERY HEATING CIRCUITS AND METHODS USING TRANSFORMERS

1. CROSS-REFERENCE TO RELATED APPLICATIONS

This application claims priority to Chinese Patent Application No. 201010603414.5, filed Dec. 23, 2010, being incorporated by reference herein for all purposes.

Additionally, this application is related to International Application Publication No. WO2010/145439A1 and Chinese Application Publication No. CN102055042A, both these two applications being incorporated by reference herein for all purposes.

2. BACKGROUND OF THE INVENTION

The present invention pertains to electric and electronic field, in particular related to a battery heating circuit.

Considering cars need to run under complex road conditions and environmental conditions or some electronic devices are used under harsh environmental conditions, the battery, which serves as the power supply unit for electric-motor cars or electronic devices, need to be adaptive to these complex conditions. In addition, besides these conditions, the service life and charge/discharge cycle performance of the battery need to be taken into consideration; especially, when electric-motor cars or electronic devices are used in low temperature environments, the battery needs to have outstanding low-temperature charge/discharge performance and higher input/output power performance.

Usually, under low temperature conditions, the resistance of the battery will increase, and so will the polarization; therefore, the capacity of the battery will be reduced.

To keep the capacity of the battery and improve the charge/discharge performance of the battery under low temperature conditions, some embodiments of the present invention provide a battery heating circuit.

3. BRIEF SUMMARY OF THE INVENTION

The objective of certain embodiments of the present invention is to provide a battery heating circuit, in order to solve the problem of decreased capacity of the battery caused by increased resistance and polarization of the battery under low temperature conditions.

The battery heating circuit provided by certain embodiments of the present invention comprises a switch unit, a switching control module, a one-way semiconductor component, a damping component and a transformer, wherein the switching control module is electrically connected with the switch unit; the battery, damping component, first winding of the transformer, and switch unit are connected in series with each other to constitute a battery discharging circuit; the battery, damping component, second winding of the transformer, and one-way semiconductor component are connected in series with each other to constitute a battery charging circuit.

When the battery is to be heated up, the switch unit can be controlled by the switching control module to switch on, and then can be controlled to switch off when the current in the battery discharging circuit reaches a preset value; after that, the transformer transfers the stored energy back to the battery. In that process, the damping component generates heat as the current flows through it, and thereby heats up the battery. The transformer takes a current limiting role; in addition, the preset value can be set according to the properties of the battery; therefore, the magnitude of current in the battery charging/discharging circuit is controllable, and damages to the battery caused by over-current can be avoided. In addition, since the magnitude of current is controllable, the switch unit is protected against burnt due to generation of vast heat.

Moreover, the transformer in certain embodiments of the present invention serves as an energy storage component, and has current limiting function. It can transfer the energy stored in it back to the battery through the battery charging circuit, and thereby can reduce the energy loss in the heating process.

Other characteristics and advantages of the present invention will be further described in detail in the following section for embodiments.

4. BRIEF DESCRIPTION OF THE DRAWINGS

The accompanying drawings, as a part of this description, are provided here to facilitate further understanding of the present invention, and are used in conjunction with the following embodiments to explain the present invention, but shall not be comprehended as constituting any limitation on the present invention. In the figures.

5. DETAILED DESCRIPTION OF THE INVENTION

Figure 1:
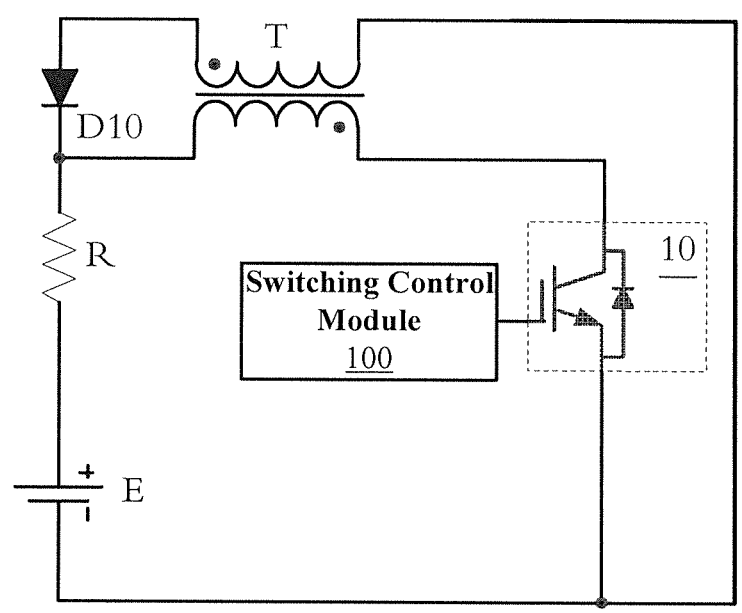
FIG. 1 is a circuit diagram of the heating circuit provided in one embodiment of the present invention.

Certain embodiments of the present invention are described in detail below, with reference to the accompanying drawings. It should be appreciated that the embodiments described here are only provided to describe and explain the present invention, but shall not be deemed as constituting any limitation on the present invention.

It is noted that, unless otherwise specified, when mentioned hereafter in this description, the term "switching control module" may refer to any controller that can output control commands (e.g., pulse waveforms) under preset conditions or at preset times and thereby control the switch unit connected to it to switch on or switch off accordingly, according to some embodiments. For example, the switching control module can be a PLC. Unless otherwise specified, when mentioned hereafter in this description, the term "switch" may refer to a switch that enables ON/OFF control by using electrical signals or enables ON/OFF control on the basis of the characteristics of the component according to certain embodiments. For example, the switch can be either a one-way switch (e.g., a switch composed of a two-way switch and a diode connected in series, which can be conductive in one direction) or a two-way switch (e.g., a Metal Oxide Semiconductor Field Effect Transistor (MOSFET) or an IGBT with an anti-parallel freewheeling diode). Unless otherwise specified, when mentioned hereafter in this description, the term "two-way switch" may refer to a switch that can be conductive in two directions, which can enable ON/OFF control by using electrical signals or enable ON/OFF control on the basis of the characteristics of the component according to some embodiments. For example, the two-way switch can be a MOSFET or an IGBT with an anti-parallel freewheeling diode. Unless otherwise specified, when mentioned hereafter in this description, the term "one-way semiconductor component" may refer to a semiconductor component that can be conductive in one direction, such as a diode, according to certain embodiments. Unless otherwise specified, when mentioned hereafter in this description, the term "charge storage component" may refer to any device that can enable charge storage, such as a capacitor, according to some embodiments. Unless otherwise specified, when mentioned hereafter in this description, the term "current storage component" may refer to any device that can store current, such as an inductor, according to certain embodiments. Unless otherwise specified, when mentioned hereafter in this description, the term "forward direction" may refer to the direction in which the energy flows from the battery to the energy storage circuit, and the term "reverse direction" may refer to the direction in which the energy flows from the energy storage circuit to the battery, according to some embodiments. Unless otherwise specified, when mentioned hereafter in this description, the term "battery" may comprise primary battery (e.g., dry battery or alkaline battery, etc.) and secondary battery (e.g., lithium-ion battery, nickel-cadmium battery, nickel-hydrogen battery, or lead-acid battery, etc.), according to certain embodiments. Unless otherwise specified, when mentioned hereafter in this description, the term "damping component" may refer to any device that inhibits current flow and thereby enables energy consumption, such as a resistor, etc., according to some embodiments. Unless otherwise specified, when mentioned hereafter in this description, the term "main loop" may refer to a loop composed of battery, damping component, switch unit and energy storage circuit connected in series according to certain embodiments.

It should be noted specially that, considering different types of batteries have different characteristics, in some embodiments of the present invention, "battery" may refer to an ideal battery that does not have internal parasitic resistance and parasitic inductance or has very low internal parasitic resistance and parasitic inductance, or may refer to a battery pack that has internal parasitic resistance and parasitic inductance; therefore, those skilled in the art should appreciate that if the battery is an ideal battery that does not have internal parasitic resistance and parasitic inductance or has very low internal parasitic resistance and parasitic inductance, the damping component R1 may refer to a damping component external to the battery and the current storage component L1 may refer to a current storage component external to the battery; if the battery is a battery pack that has internal parasitic resistance and parasitic inductance, the damping component R1 may refer to a damping component external to the battery or refer to the parasitic resistance in the battery pack, and the current storage component L1 may refer to a current storage component external to the battery or refer to the parasitic inductance in the battery pack, according to certain embodiments.

To ensure the normal service life of the battery, according to some embodiments, the battery can be heated under low temperature condition, which is to say, when the heating condition is met, the heating circuit is controlled to start heating for the battery; when the heating stop condition is met, the heating circuit is controlled to stop heating, according to certain embodiments.

In the actual application of battery, the battery heating condition and heating stop condition can be set according to the actual ambient conditions, to ensure normal charge/discharge performance of the battery, according to some embodiments.

FIG. 1 is a circuit diagram of the heating circuit provided in one embodiment of the present invention. As shown in FIG. 1, one embodiment of the present invention provides a battery heating circuit, comprising a switch unit 10, a switching control module 100, a one-way semiconductor component D10, a damping component R and a transformer T, wherein: the switching control module 100 is electrically connected with the switch unit 10; the battery E, damping component R, first winding of the transformer T, and switch unit 10 are connected in series with each other to constitute a battery discharging circuit; and the battery E, damping component R, second winding of the transformer T, and one-way semiconductor component D10 are connected in series with each other to constitute a battery charging circuit.

Wherein: the switching control module 100 can control the switch unit 10 to switch off when the current flowing through the battery E reaches a preset value in the positive half cycle, and can control the switch unit 10 to switch on when the current flowing through the battery E reaches zero in the negative half cycle. By keeping the current flowing through the damping component R continuously, the damping component R generates heat, and thereby heats up the battery E.

Figure 2:
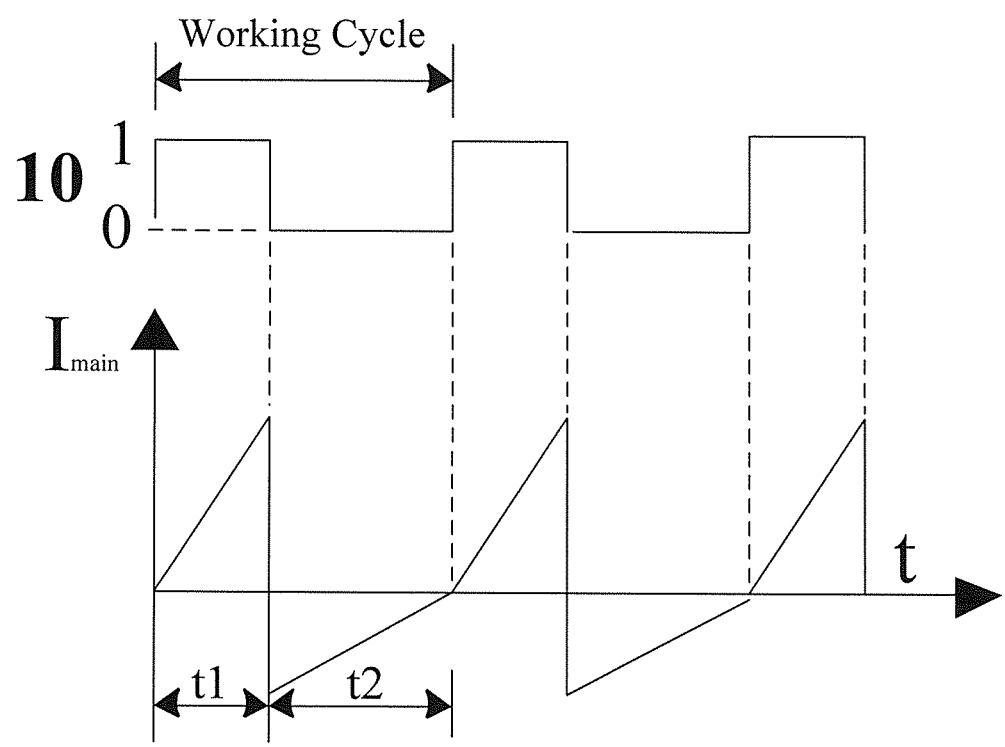
FIG. 2 is a timing sequence diagram of waveform of the heating circuit provided in one embodiment of the present invention.

FIG. 2 is a timing sequence diagram of waveform of the heating circuit provided in one embodiment of the present invention. Hereunder the working process of the heating circuit provided in one embodiment of the present invention will be described, with reference to FIG. 2. First, the switching control module 100 controls the switch unit 10 to switch on; now, the positive electrode of the battery E is connected with the negative electrode of the battery E and forms a closed circuit; thus, the current $I_{main}$ in the battery E rises up slowly due to the existence of the inductance in transformer T (see the time period t1), and some energy is stored in the transformer T. When the current $I_{main}$ in the battery E reaches a preset value, the switching control module 100 controls the switch unit 10 to switch off; now, the transformer T transfers the energy stored in it back to the battery through the one-way semiconductor component D10, as indicated by the time period t2. After that, when the current in the battery E is zero, the switching control module 100 controls the switch unit 10 to switch on again, and thus another cycle starts. The cycles continue on and on, till the battery E is heated up satisfactorily.

In the working process of the heating circuit described above, owing to the existence of the inductance in the transformer T, the current $I_{main}$ in the battery E is limited; alternatively, the magnitude of the current $I_{main}$ in the battery E can be controlled by controlling the switch-off time of the switch unit 10 with the switching control module 100. Moreover, the magnitude of the charging/discharging current of the battery E can be controlled by changing the ratio of winding between the first winding (i.e., primary coil) and the second winding (i.e., secondary coil) of the transformer T. The higher the ratio of winding between the first winding and the second winding is, the smaller the current charged back from the second wiring to the battery E will be.

Figure 3:
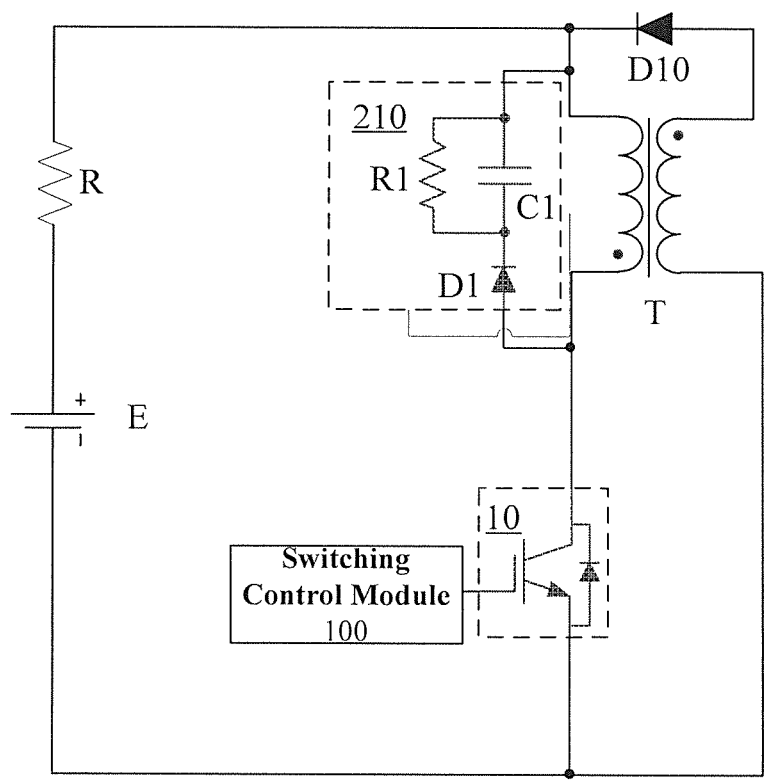
FIG. 3 is a circuit diagram of the heating circuit according to the first embodiment of the present invention.

When the switch unit 10 switches from ON state to OFF state, very high voltage will be induced in the first winding of the transformer T; when the induced voltage is superposed with the voltage of the battery E on the switch unit 10, damage to the switch unit 10 may occur. Preferably, as shown in FIG. 3, the heating circuit can further comprises a first voltage absorption circuit 210, which is connected in parallel between the ends of the first winding of the transformer T, and the first voltage absorption circuit 210 is configured to consume the voltage induced in the first winding when the switch unit 10 switches off, so as to protect the switch unit 10 from damaged by the induced voltage. The first voltage absorption circuit 210 can comprise a one-way semiconductor component D1, a charge storage component C1 and a damping component R1, wherein: the one-way semiconductor component D1 is connected in series with the charge storage component C1, and the damping component R1 is connected in parallel between the ends of the charge storage component C1. Thereby, when the switch unit 10 switches from ON state to OFF state, the voltage induced in the first winding of the transformer T will force the one-way semiconductor component D1 to switch on, and the electric energy will be sustained via the charge storage component C1; in addition, after that, the electric energy is consumed by the damping component R1, and thereby the voltage induced in the first winding of the transformer T is absorbed, to avoid damage to the switch unit 10.

Figure 4:
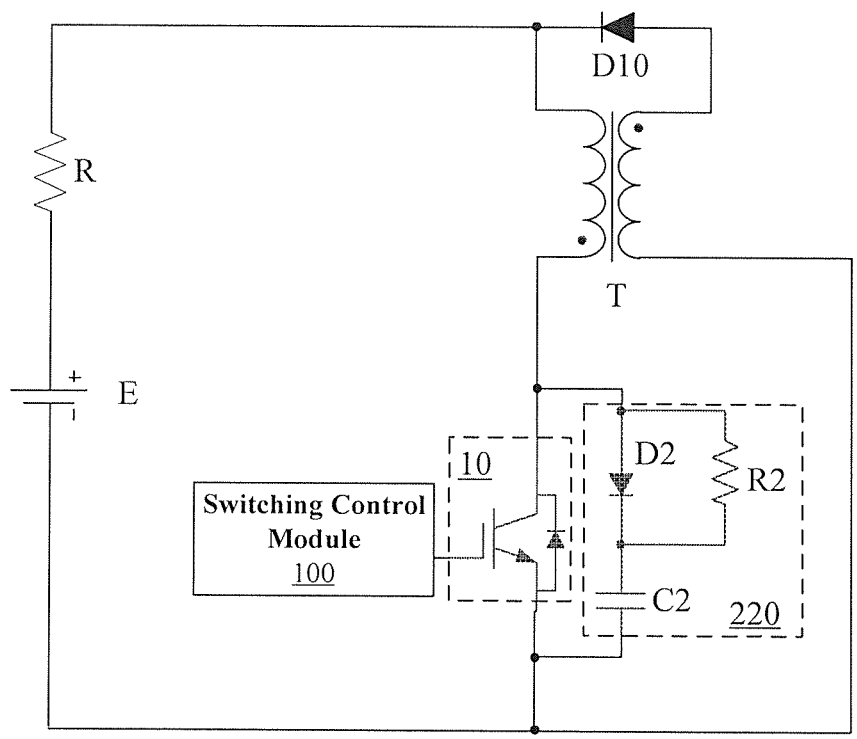
FIG. 4 is a circuit diagram of the heating circuit according to the second embodiment of the present invention.

Preferably, as shown in FIG. 4, the heating circuit can further comprise a second voltage absorption circuit 220 connected in parallel between the ends of the switch unit 10, which is also configured to consume the voltage induced in the first winding of the transformer T, so as to avoid damage to the switch unit 10. The second voltage absorption circuit 220 comprises a one-way semiconductor component D2, a charge storage component C2 and a damping component R2, wherein: the one-way semiconductor component D2 is connected in series with the charge storage component C2, the damping component R2 is connected in parallel between the ends of the one-way semiconductor component D2. Thereby, when the switch unit 10 switches from ON state to OFF state, the voltage induced in the first winding of the transformer T will force the one-way semiconductor component D2 to switch on, and the electric energy will be sustained via the charge storage component C2; in addition, after that, the electric energy is consumed by the damping component R2 when the switch unit 10 switches on, and thereby the voltage induced in the first winding of the transformer T is absorbed, to avoid damage to the switch unit 10.

Figure 5:
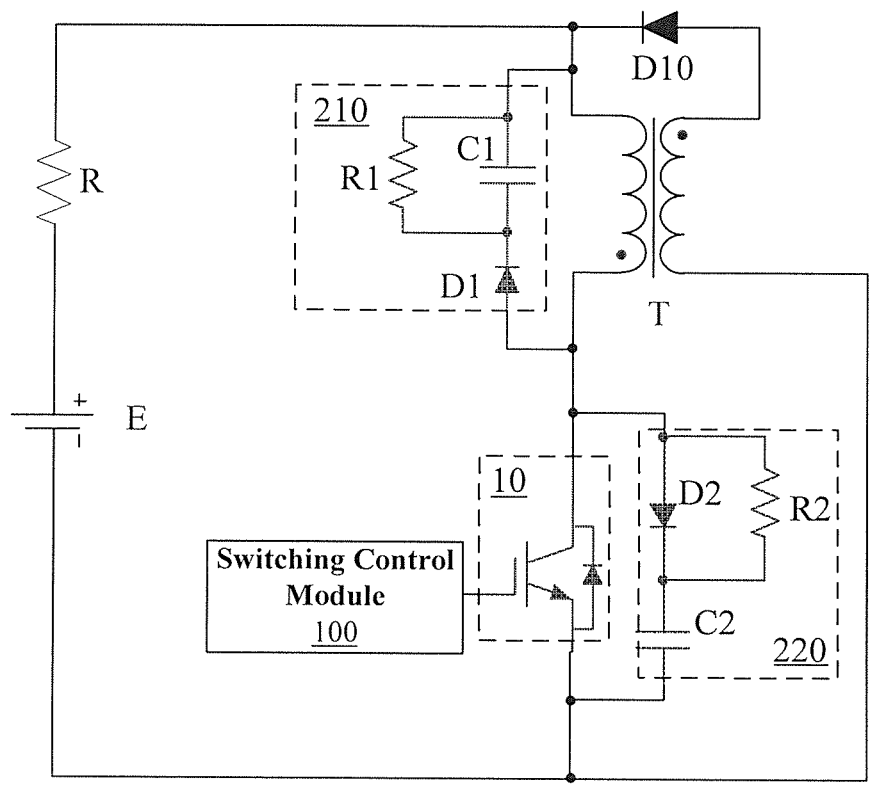
FIG. 5 is a circuit diagram of the heating circuit according to the third embodiment of the present invention.

The first voltage absorption circuit 210 and second voltage absorption circuit 210 can be contained in the heating circuit provided in one embodiment of the present invention at the same time, as shown in FIG. 5; in that case, better voltage absorption effect can be achieved, and the switch unit 10 can be protected better. Of course, the structure of the first voltage absorption circuit 210 and second voltage absorption circuit 210 is not limited to the circuit structure described above, which is to say, any applicable absorption circuit can be used here.

In addition, it should be noted: the "preset value" mentioned above shall be set according to the current endurable by the battery E and other components/components in the heating circuit, with comprehensive consideration of heating efficiency and protection of battery E against damages, as well as the size, weight and cost of the heating circuit.

Figure 6:
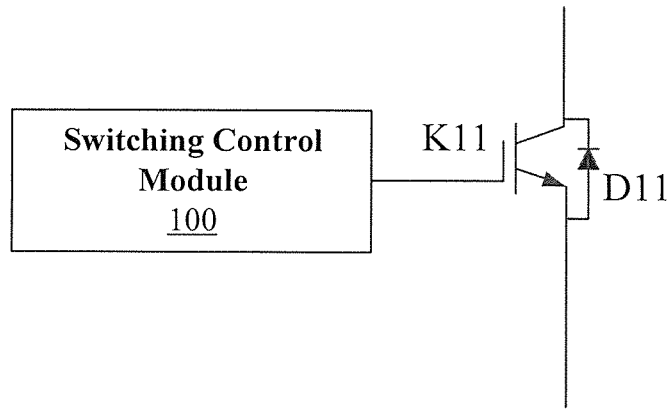
FIG. 6 is a circuit diagram of one embodiment of the switch unit in the heating circuit provided in the present invention.

FIG. 6 is a circuit diagram of one embodiment of the switch unit in the heating circuit provided in the present invention. As shown in FIG. 6, the switch unit 10 can comprise a switch K11 and a one-way semiconductor component D11 connected in parallel with the switch K11 in reverse direction, wherein: the switching control module 100 is electrically connected with the switch K11, and is configured to control ON/OFF of the branches of the switch unit 10 in forward direction by controlling ON/OFF of the switch K11.

Figure 7:
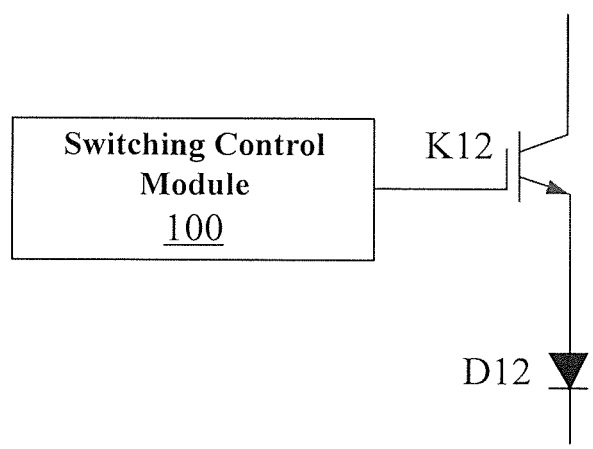
FIG. 7 is a circuit diagram of another embodiment of the switch unit in the heating circuit provided in the present invention.

FIG. 7 is a circuit diagram of another embodiment of the switch unit in the heating circuit provided in the present invention. As shown in FIG. 7, the switch unit 10 can comprise a switch K12 and a one-way semiconductor component D12 connected in series with each other, wherein: the switching control module 100 is electrically connected with the switch K12, and is configured to control ON/OFF of the switch unit 10 by controlling ON/OFF of the switch K12.

The heating circuit provided in certain embodiments of the present invention has the following advantages:

(1) With the current limiting function of the transformer T, the magnitude of current in the battery charging/discharging circuit can be limited, and thereby the battery and switch unit can be protected against damage by heavy current;

(2) The magnitude of current in the battery charging/discharging circuit can also be controlled by controlling the switch-off time of the switch unit 10, so as to protect the battery and switch unit against damage by heavy current; and/or (3) The transformer T is an energy storage component, which can store the energy in the battery discharging process, and then charge back the energy to the battery, so as to reduce the energy loss in the battery heating process.

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits.

While some embodiments of the present invention are described above with reference to the accompanying drawings, the present invention is not limited to the details of those embodiments. Those skilled in the art can make modifications and variations, without departing from the spirit of the present invention. However, all these modifications and variations shall be deemed as falling into the scope of the present invention.

In addition, it should be noted that the specific technical features described in the above embodiments can be combined in any appropriate way, provided that there is no conflict. To avoid unnecessary repetition, certain possible combinations are not described specifically. Moreover, the different embodiments of the present invention can be combined as needed, as long as the combinations do not deviate from the spirit of the present invention. However, such combinations shall also be deemed as falling into the scope of the present invention.

Hence, although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A heating circuit for a battery, the heating circuit comprising:
    a switch unit, a switching control module, a first one-way semiconductor component, a first damping component and a transformer, wherein:

the switching control module is electrically connected with the switch unit;

the battery, the first damping component, a first winding of the transformer, and the switch unit are connected in a first loop with each other to constitute a battery discharging circuit; and the battery, the first damping component, a second winding of the transformer, and the first one-way semiconductor component are connected in a second loop with each other to constitute a battery charging circuit.

2. The heating circuit according to claim 1, wherein the first damping component is a parasitic resistor in the battery.

3. The heating circuit according to claim 1, wherein the heating circuit further comprises a voltage absorption circuit connected in parallel between the ends of the first winding of the transformer, and the voltage absorption circuit is configured to consume a voltage induced in the first winding when the switch unit switches off.

4. The heating circuit according to claim 3, wherein the voltage absorption circuit comprises a second one-way semiconductor component, a charge storage component and a second damping component, wherein the second one-way semiconductor component is connected in a third loop with the charge storage component, and the second damping component is connected in parallel between the ends of the charge storage component.

5. The heating circuit according to claim 4, wherein the charge storage component is a capacitor, and the second damping component is a resistor.

6. The circuit according to claim 1, wherein the heating circuit further comprises a voltage absorption circuit connected in parallel between the ends of the switch unit, and the voltage absorption circuit is configured to consume a voltage induced in the first winding when the switch unit switches off.

7. The heating circuit according to claim 6, wherein the voltage absorption circuit comprises a second one-way semiconductor component, a charge storage component and a second damping component, wherein the second one-way semiconductor component is connected in a third loop with the charge storage component, and the second damping component is connected in parallel between the ends of the second one-way semiconductor component.

8. The heating circuit according to claim 7, wherein the charge storage component is a capacitor, and the second damping component is a resistor.

9. The heating circuit according to claim 1, wherein the switch unit comprises a switch and a second one-way semiconductor component connected in parallel with the switch in reverse direction, the switching control module is electrically connected with the switch, and the switching control module is configured to control ON/OFF of branches of the switch unit in forward direction by controlling ON/OFF of the switch.

10. The heating circuit according to claim 1, wherein the switch unit comprises a switch and a second one-way semiconductor component connected in series with each other, and the switching control module is electrically connected with the switch, and the switching control module is configured to control ON/OFF of the switch unit by controlling ON/OFF of the switch.

11. A heating circuit for a battery, the heating circuit comprising:

a switch unit, a switching control module, a one-way semiconductor component, a damping component and a transformer, wherein:

the switching control module is electrically connected with the switch unit;

the battery, the damping component, a first winding of the transformer, and the switch unit are connected in a first loop with each other to constitute a battery discharging circuit;

the battery, the damping component, a second winding of the transformer, and the one-way semiconductor component are connected in a second loop with each other to constitute a battery charging circuit; and the switching control module controls the switch unit to switch off when a current flowing through the battery reaches a preset value in a positive half cycle, and controls the switch unit to switch on when the current flowing through the battery reaches zero in a negative half cycle.

* * * * *